United States Patent
Mochizuki

(10) Patent No.: US 7,424,043 B2
(45) Date of Patent: Sep. 9, 2008

(54) SURFACE-EMITTING TYPE SEMICONDUCTOR LASER

(75) Inventor: Masamitsu Mochizuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/761,748

(22) Filed: Jun. 12, 2007

(65) Prior Publication Data
US 2007/0297484 A1 Dec. 27, 2007

(30) Foreign Application Priority Data
Jun. 27, 2006 (JP) .............................. 2006-176372
Mar. 27, 2007 (JP) .............................. 2007-080820

(51) Int. Cl.
*H01S 5/00* (2006.01)

(52) U.S. Cl. .............. 372/43.01; 372/45.01; 372/50.11; 372/50.124

(58) Field of Classification Search .............. 372/43.01, 372/50.11
See application file for complete search history.

(56) References Cited

U.S. PATENT DOCUMENTS

2005/0123014 A1    6/2005  Shimizu et al.
2006/0227836 A1*  10/2006  Omori et al. ........... 372/50.124
2006/0285568 A1*  12/2006  Watanabe et al. ...... 372/50.121

FOREIGN PATENT DOCUMENTS

| EP | 1 387 452 A1 | 2/2004 |
|---|---|---|
| JP | 2003-086895 | 3/2003 |
| JP | A-2003-86895 | 3/2003 |
| WO | WO 02/071562 A2 | 9/2002 |
| WO | WO 2004/015454 A2 | 2/2004 |

* cited by examiner

*Primary Examiner*—Dung T Nguyen
(74) *Attorney, Agent, or Firm*—Oliff & Berridge, PLC

(57) ABSTRACT

A surface-emitting type semiconductor laser includes: a lower mirror; an active layer formed above the lower mirror; and an upper mirror formed above the active layer, wherein each of the lower mirror and the upper mirror is composed of a multilayer mirror in which a plurality of unit multilayer films are laminated, each of the unit multilayer films includes a pair of a lower refractive index layer and a higher refractive index layer laminated in a thickness direction, each of the unit multilayer films satisfies a formula (1) below, and the active layer satisfies a formula (2) below, $$d_D < \lambda/2n_D \quad (1)$$

$$d_A > m\lambda/2n_A \quad (2)$$

where $\lambda$ is a design wavelength of the surface-emitting type semiconductor laser, m is a positive integer, $d_D$ is a thickness of the unit multilayer film, $n_D$ is a mean refractive index of the unit multilayer film, $d_A$ is a thickness of the active layer, and $n_A$ is a mean refractive index of the active layer.

9 Claims, 6 Drawing Sheets

SURFACE-EMITTING TYPE SEMICONDUCTOR LASER

BACKGROUND

1. Technical Field

Several aspects of the present invention relate to surface-emitting type semiconductor lasers.

2. Related Art

With applications of surface-emitting type semiconductor lasers having expanded in recent years, it is desired further to reduce the number of oscillation modes of surface-emitting type semiconductor lasers while achieving a higher output. For example, in the case of a surface-emitting type semiconductor laser having an oxide aperture, the number of oscillation modes may be reduced by reducing the diameter of the oxide aperture.

It is noted that the output of a semiconductor laser increases with an increase in the injection current, and reaches a maximum value (i.e., a rolloff point) at a certain current. This is because, in a semiconductor laser, its gain spectrum shifts with an increase in the device temperature which is caused by injection current, and the gain reaches a maximum value at a certain temperature. When the diameter of the oxide aperture of the surface-emitting type semiconductor laser is relatively small, the temperature of the device would readily elevate, and its rolloff point is reached at a relatively low injection current, such that a sufficient output may not be obtained. In this connection, in an attempt, to prevent an increase in the device temperature, Japanese laid-open patent application JP-A-2003-86895 describes a method in which a mesa reaching the current confinement region is formed around the light emitting section, and an electrode is directly formed over the groove. As a result, the distance between a heat generating section and the electrode is shortened, thereby improving the heat radiation efficiency.

SUMMARY

In accordance with an advantage of some aspects of the present invention, it is possible to provide a surface-emitting type semiconductor laser in which the number of oscillation modes can be reduced, and a higher output can be achieved, compared to a case where the diameter of the current aperture is simply reduced.

In accordance with an embodiment of the invention, a surface-emitting type semiconductor laser includes: a lower mirror, an active layer formed above the lower mirror, and an upper mirror formed above the active layer) wherein each of the lower mirror and the upper mirror is composed of a multilayer mirror in which a plurality of unit multilayer films are laminated, each of the unit multilayer films includes a pair of a lower refractive index layer and a higher refractive index layer laminated in a thickness direction, each of the unit multilayer films satisfies a formula (1) below, and the active layer satisfies a formula (2) below, $$d_D < \lambda/2n_D \quad (1)$$

$$d_A > m\lambda/2n_A \quad (2)$$

where $\lambda$ is a design wavelength of the surface-emitting type semiconductor laser,
m is a positive integer,
$d_D$ is a thickness of the unit multilayer film,
$n_D$ is a mean refractive index of the unit multilayer film,
$d_A$ is a thickness of the active layer, and
$n_A$ is a mean refractive index of the active layer.

In the surface-emitting type semiconductor laser in accordance with the present embodiment, the formulae (1) and (2) described above are satisfied. By this, for example, an energy increasing rate of higher order resonance modes can be reduced while scarcely reducing an energy increasing rate of lower order resonance modes among light that resonates in the active layer (hereafter referred to as "resonance light"), without regard to the thickness or the diameter of the current aperture. This is also confirmed in a numerical calculation example to be described below. As a result, resonance light of higher order modes would be prevented from being laser-oscillated without reducing the diameter of the current aperture. Hence, higher output can be obtained compared to a case where the diameter of the current aperture is simply reduced. Therefore, in accordance with the present embodiment, it is possible to provide a surface-emitting type semiconductor laser that can reduce the number of oscillation modes, and provide a higher output, compared to a case where the diameter of the current aperture is simply reduced.

It is noted that, in the invention, the design wavelength is a wavelength of light having the maximum intensity among light generated by the surface-emitting type semiconductor laser.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case in which "B" is formed directly on "A," and a case in which "B" is formed over "A" through another member on "A."

Also, in the present embodiment, the case of "a pair of a lower refractive index layer and a higher refractive index layer laminated in a thickness direction" includes a case in which another layer is laminated between the lower refractive index layer and the higher refractive index layer.

Also, in the description concerning the invention, for example, $\lambda/2n_D$ expresses $\lambda/(2n_D)$).

In the surface-emitting type semiconductor laser in accordance with an aspect of the embodiment of the invention, the formula (1) may satisfy at least one of the plurality of unit multilayer films.

In the surface-emitting type semiconductor laser in accordance with an aspect of the embodiment of the invention, the formula (1) may satisfy all of the plurality of unit multilayer films.

In the surface-emitting type semiconductor laser in accordance with an aspect of the embodiment of the invention, those of the plurality of unit multilayer films which do not satisfy the formula (1) may satisfy a formula (3) below, $$d_D = \lambda/2n_D \quad (3)$$

The surface-emitting type semiconductor laser in accordance with an aspect of the embodiment of the invention may satisfy a formula (4) below, $$d_H + d_L < \lambda/4n_L + \lambda/4n_H \quad (4)$$

where $d_H$ is a thickness of the lower refractive index layer film,
$d_L$ is a thickness of the higher refractive index layer,
$n_L$ is a refractive index of the lower refractive index layer, and
$n_H$ is a refractive index of the higher refractive index layer.

In the surface-emitting type semiconductor laser in accordance with an aspect of the embodiment, the lower mirror and the upper mirror are distributed Bragg reflection type (DBR) mirrors.

In the surface-emitting type semiconductor laser in accordance with an aspect of the embodiment, among light that resonates in the active layer, lower order resonance modes may arrive at laser oscillation, and higher order resonance modes may not arrive at laser oscillation.

In the surface-emitting type semiconductor laser in accordance with an aspect of the embodiment, among light that resonates in the active layer, the energy increasing rate of a lower order resonance modes may be positive, and the energy increasing rate of a higher order resonance modes may be negative.

In the surface-emitting type semiconductor laser in accordance with an aspect of the embodiment, the lower order resonance mode may be the $0^{th}$ order resonance mode, and the higher order resonance mode may be the first ($1^{st}$) or higher order resonance mode.

DESCRIPTION OF EXEMPLARY EMBODIMENTS

Preferred embodiments of the invention are described below with reference to the accompanying drawings.

1. First, a surface-emitting type semiconductor laser 100 in accordance with an embodiment is described.

Figure 1:
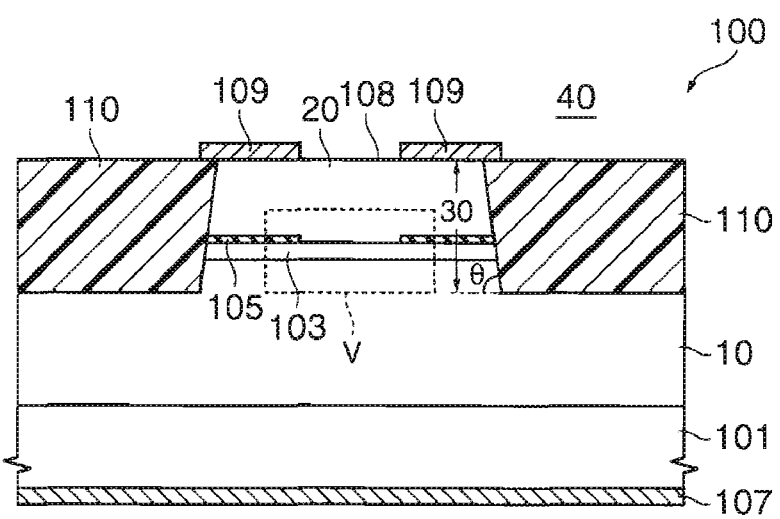
FIG. 1 is a schematic cross-sectional view of a surface-emitting type semiconductor laser in accordance with an embodiment of the invention.
Figure 2:
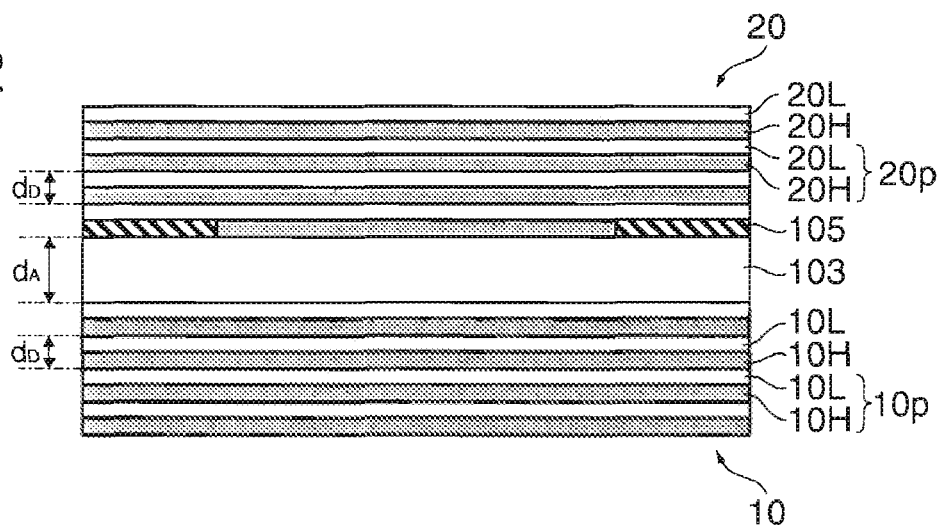
FIG. 2 is a schematic cross-sectional view in part of the surface-emitting type semiconductor laser in accordance with the embodiment of the invention.

FIG. 1 is a schematic cross-sectional view of the surface-emitting type semiconductor laser 100, and FIG. 2 is a schematic cross-sectional view in enlargement of a region V in FIG. 1.

The surface-emitting type semiconductor laser 100 may include, as shown in FIG. 1, a substrate 101, a lower mirror 10, an active layer 103, an upper mirror 20, a insulation layer 110, a first electrode 107 and a second electrode 109.

The substrate 101 may be formed from, for example, a first conductivity type (for example, n-type) GaAs substrate.

The lower mirror layer 10 of, for example, the first conductivity type is formed on the substrate 101. The lower mirror 10 is a multilayer mirror in which unit multilayer films 10p are laminated in plurality. Each of the unit multilayer films 10p may be composed of, for example, a lower refractive index layer 10L and a higher refractive index layer 10H formed below the lower refractive index layer 10L, as shown in FIG. 2. In other words, the lower mirror 10 may be composed of, for example, a distributed Bragg reflection type (DBR) mirror of alternately laminated lower refractive index layers 10L and higher refractive index layers 10H. The lower refractive index layer 10L may be composed of, for example, an n-type $Al_{0.9}Ga_{0.1}As$ layer (having a refractive index of 3.049). The higher refractive index layer 10H may be composed of, for example, an n-type $Al_{0.15}Ga_{0.85}As$ layer (having a refractive index of 3.525). The number of the unit multilayer films 10p (the number of the pairs) may be, for example, 35.5 pairs-43.5, pairs. It is noted that, as the unit multilayer films 10p of the lower mirror 10, any layers can be used if the layers compose the lower mirror 10 through repeating the layer structures of the unit multilayer films 10p. For example, the unit multilayer film 10p may be composed of a lower refractive index layer 10L and a higher refractive index layer 10H formed on the lower refractive index layer 10L.

The active layer 103 is formed on the lower mirror 10. The active layer 103 has a multiple quantum well (MQW) structure in which quantum well structures each formed from, for example, a GaAs well layer and an $Al_{0.3}Ga_0As$ barrier layer are laminated in three layers.

The upper mirror layer 20 of, for example, a second conductivity type (for example, p-type) is formed on the active layer 103. The upper mirror 20 is a multilayer mirror in which unit multilayer films 20p are laminated in plurality. Each of the unit multilayer films 20p may be composed of, for example, a lower refractive index layer 20L and a higher refractive index layer 20L formed below the lower refractive index layer 20L, as shown in FIG. 2. In other words, the upper mirror 20 may be composed of, for example, a DBR mirror of alternately laminated lower refractive index layers 20L and higher refractive index layers 20H. The lower refractive index layer 20L may be composed of, for example, a p-type $Al_{0.9}Ga_{0.1}As$ layer (having a refractive index of 3.049). The higher refractive index layer 20H may be composed of, for example, a p-type $Al_{0.15}Ga_{0.85}As$ layer (having a refractive index of 3.525). The number of the unit multilayer films 20p (the number of the pairs) may be, for example, 19 pairs-31 pairs. It is noted that, as the unit multilayer films 20p of the upper mirror 20, any layers can be used if the layers compose the upper mirror 20 through repeating the layer structures of the unit multilayer films 20p. For example, the unit multilayer film 20p may be composed of a lower refractive index layer 20L and a higher refractive index layer 20H formed on the lower refractive index layer 20L.

In the present embodiment, for example, all of the plurality of unit multilayer films 10p and 20p described above may satisfy a formula (1) below. Also, in accordance with the present embodiment, the active layer 103 satisfies a formula (2) below.

$$d_D < \lambda/2n_D \quad (1)$$

$$d_A > m\lambda/2n_A \quad (2)$$

where λ is a designs wavelength of the surface-emitting type semiconductor laser 100,
m is a positive integer,
$d_D$ is a thickness of the unit multilayer film 10p, 20p,
$n_D$ is a mean refractive index of the unit multilayer film 10p, 20p,
$d_A$ is a thickness of the active layer 103, and
$n_A$ is a means refractive index of the active layer 103.

It is noted that the lower limit value of $d_D$ and the upper limit value of $d_A$ may be decided depending on whether λ is in a reflection band of the multilayer film mirrors (the lower mirror 10 and the upper mirror 20). The lower limit value of $d_D$ may be a value that is smaller by, for example, about 5% than the value of $\lambda/2n_D$, in the case of a multilayer film mirror composed of $Al_xGa_{1-x}As$ (x=0.15, 0.90) with λ being 850 nm. Also, the upper limit value of $d_A$ may be appropriately decided according to the design wavelength λ, and may be a value that is greater by, for example, about 20% than the value of $m\lambda/2n_A$.

Also, the above-described formulae (1) and (2) may be rewritten by a formula (A) below.

$$2n_D \cdot d_D < \lambda < (2n_A \cdot d_A)/m \quad (A)$$

Also, based on the formulae (1) and (2) described above, the ratio ($d_A/d_D$) between the thickness $d_A$ of the active layer 103 and the thickness $d_D$ of the unit multilayer film 10p, 20p may satisfy a formula (B) below.

$$d_A/d_D > mn_D/n_A \quad (B)$$

The design wavelength λ may be, for example, 780 nm, 850 nm, 1300 nm or the like, without any particular limitation. Also, when m is, for example, 2, a 1λ resonator is formed, but m is not particularly limited.

In the present embodiment, for example as shown in FIG. 2, the thickness of each of the plural unit multilayer films 10p in the lower mirror 10 and the thickness of each of the plural unit multilayer films 20p in the upper mirror 20 may be the same $d_D$. Also, in accordance with the present embodiment, for example, a mean refractive index of each of the plural unit multilayer films 10p in the lower mirror 10, and a mean refractive index of each of the plural unit multilayer films 20p in the upper mirror 20 may be the same $n_D$.

Also, for example, at least two plural unit multilayer films 10p among the plural unit multilayer films 10p in the lower mirror 10 may have mutually different thicknesses. Also, for example, at least two plural unit multilayer films 10p among the plural unit multilayer films 10p in the lower mirror 10 may have mutually different mean refractive indexes. Similarly, at least two plural unit multilayer films 20p among the plural unit multilayer films 20p in the upper mirror 20 may have mutually different thicknesses and mutually different mean refractive indexes. The formula (1) described above may be satisfied by at least one of the plural unit multilayer films 10p, 20p in the lower mirror 10 and the upper mirror 20. For example, those of the unit multilayer films 10p, 20p that do not satisfy the formula (1) described above, may satisfy a formula (3) below.

$$d_D = \lambda/2n_D \quad (3)$$

Also, for example, as shown in FIG. 2, when the unit multilayer films 10p of the lower mirror 10 are composed of lower refractive index layers 10L and higher refractive index layers 10H, and the unit multilayer films 20p of the upper mirror 20 are composed of lower refractive index layers 20L and higher refractive index layers 20H, the formula (1) described above can be rewritten by a formula (4) below.

$$d_H + d_L < \lambda/4n_L + \lambda/4n_H \quad (4)$$

where $d_H$ is a thickness of the lower refractive index layer film,
$d_L$ is a thickness of the higher refractive index layer,
$n_L$ is a refractive index of the lower refractive index layer, and
$n_H$ is a refractive index of the higher refractive index layer.

Also, the number of laminated unit multilayer films 10p in the lower mirror 10, and the number of laminated unit multilayer films 20p in the upper mirror 20 may be appropriately adjusted, whereby the threshold value of the surface-emitting type semiconductor laser 100 can be adjusted.

The lower mirror 10, the active layer 103 and the upper mirror 20 can form a vertical resonator. It is noted that the composition of each of the layers and the number of the layers composing the lower mirror 10, the active layer 103 and the upper mirror 20 may be appropriately adjusted depending on the requirements. The p-type upper mirror 20, the active layer 103 that is not doped with an impurity and the n-type lower mirror 10 form a pin diode. The upper mirror 20, the active layer 103 and a portion of the lower mirror 10 may form, for example, a columnar semiconductor laminate (hereafter referred to as a "columnar section") 30. The columnar section 30 has a plane configuration that is, for example, in a circular shape.

Also, as shown in FIG. 1, for example, at least one of the layers composing the upper mirror 20 can be formed as a lateral current confinement region 105. The lateral current confinement region 105 is formed in a region near the active layer 103. As the lateral current confinement region 105, for example, some of AlGaAs layers that are selectively oxidized or protons-implanted can be used. The lateral current confinement region 105 is an insulation layer having an opening section. The current confinement region 105 is formed in a ring shape.

The first electrode 107 is formed on the back surface (the surface on the opposite side of the lower mirror 10) of the substrate 101. The first electrode 107 is electrically connected to the lower mirror 10 through the substrate 101. The first electrode 107 may be formed, for example, on the top surface of the lower mirror 10.

The second electrode 109 is formed on the upper mirror 20 and the insulation layer 110. The second electrode 109 is electrically connected to the upper mirror 20. The second electrode 109 has an opening section on the columnar section 30. The opening section forms a region where the second electrode 109 is not provided on the top surface of the upper mirror 20. This region defines a laser emission surface 108. The emission surface 108 has a plane configuration that is, for example, a circular shape.

The insulation layer 110 is formed on the lower mirror 10. The insulation layer 110 is formed in a manner to surround the columnar section 30. The insulation layer 110 can electrically isolate the second electrode 109 from the lower mirror 10.

2. Next, an example of the method for manufacturing the surface-emitting type semiconductor laser 100 in accordance with an embodiment is described with reference to the accompanying drawings.

Figure 3:
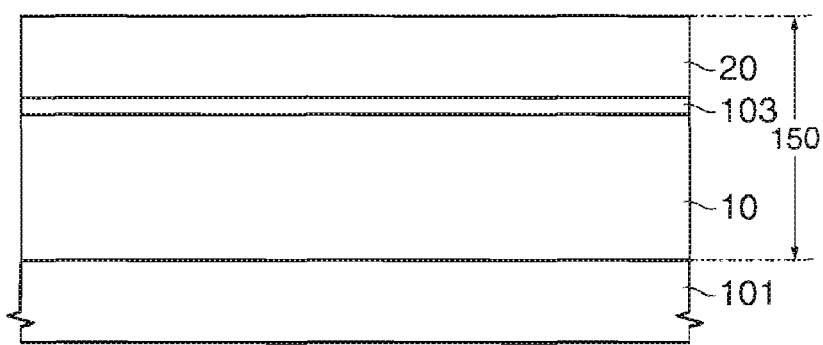
FIG. 3 is a view schematically showing a step of a method for manufacturing a surface-emitting type semiconductor laser in accordance with an embodiment of the invention.
Figure 4:
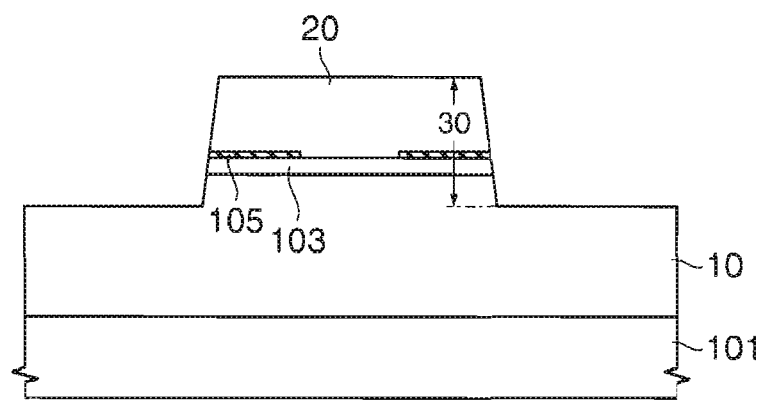
FIG. 4 is a view showing a step of the method for manufacturing a surface-emitting type semiconductor laser in accordance with the embodiment of the invention.

FIG. 3 and FIG. 4 are cross-sectional views schematically showing a manufacturing process of the surface-emitting type semiconductor laser 100 in accordance with the present embodiment shown in FIG. 1.

(1) First, as shown in FIG. 3, for example, an n-type GaAs substrate is prepared as a substrate 101. Then, a semiconductor multilayer film 150 is formed on the substrate 101 by epitaxial growth while modifying its composition. The semiconductor multilayer film 150 is formed by successively laminating semiconductor layers that compose a lower mirror 10, an active layer 103 and an upper mirror 20. When the upper mirror 20 is grown, at least one layer thereof near the active layer 103 is formed to be a layer that is later oxidized and becomes a lateral current confinement layer 105. As the layer that becomes to be the current confinement layer 105, for example, an AlGaAs layer with its Al composition being 0.95 or greater may be used.

(2) Then, as shown in FIG. 4, the semiconductor multilayer film 150 is patterned, thereby forming a lower mirror 10, an active layer 103, and an upper mirror 20, each in a desired configuration. By this, the columnar section 30 is formed. The semiconductor multilayer film 150 may be patterned by using, for example, lithography technique and etching technique.

Then, by placing the substrate 101 on which the columnar section 30 is formed through the aforementioned steps in a water vapor atmosphere, for example, at about 400° C., the layer that becomes to be the aforementioned lateral current confinement layer 105 is selectively oxidized from its side surface, thereby forming the lateral current confinement layer 105.

(3) Next, as shown in FIG. 1, a insulation layer 110 is formed on the lower mirror 10 in a manner to surround the columnar section 30. First, a insulation layer composed of polyimide resin or the like is formed over the entire surface by using, for example, a spin coat method. Then, the top surface of the columnar section 30 is exposed by using, for example, a CMP method or the like. Then, the insulation layer is patterned by, for example, lithography technique and etching technique. In this manner, the insulation layer 110 in a desired configuration can be formed.

Then a first electrode 107 and a second electrode 109 are formed. The electrodes may be formed in desired configurations, respectively, by, for example, a combination of a vacuum vapor deposition method and a lift-off method, or the like. It is noted that the order of forming the electrodes is not particularly limited.

(4) By the steps described above, the surface-emitting type semiconductor laser 100 in accordance with the present embodiment is obtained, as shown in FIG. 1.

3. Next, numerical calculation examples are described.

In the numerical calculation examples, optical simulation on the surface-emitting type semiconductor laser 100 in accordance with the present embodiment was conducted, using Finite-difference time-domain method (FDTD method). The simulation was conducted on six samples (Nos. 1-6). The samples to which numerical calculation was applied have the following structure.

The substrate 101: an n-type GaAs substrate (with a refractive index of 3.62)

The unit multilayer film 10$p$ of the lower mirror 10: a film having a two-layer structure composed of an n-type $Al_{0.9}Ga_{0.1}As$ layer (having a refractive index of 3.049), and an n-type $Al_{0.15}Ga_{0.85}As$ layer (having a refractive index of 3.525).

The mean refractive index $n_D$ of the unit multilayer film 10$p$ of the lower mirror 10: $2n_H n_L/(n_H+n_L)=3.2697$ The active layer 103: a layer having a three-QW structure in which quantum well structures each formed from a GaAs well layer (having a refractive index of 3.6201) and an $Al_{0.3}Ga_{0.7}As$ barrier layer (having a refractive index of 3.4297) are laminated in three layers The mean refractive index $n_A$ of the active layer 103: 3.3838

The unit multilayer film 20$p$ of the upper mirror 20: a film having a two-layer structure composed of a p-type $Al_{0.9}Ga_{0.1}As$ layer (having a refractive index of 3.049), and a p-type $Al_{0.15}Ga_{0.85}As$ layer (having a refractive index of 3.525)

The mean refractive index $n_D$ of the unit multilayer film 20$p$ of the upper mirror 20: $2n_H n_L/(n_H+n_L)=3.2697$ The insulation layer 110: a layer of polyimide resin (having a refractive index of 1.78)

The external atmosphere 40 of the surface-emitting type semiconductor laser 100: air (having a refractive index of 1.00)

The inclination angle (the mesa inclination angle) θ of the columnar section 30: 80 degrees The outer diameter (the mesa diameter) of the columnar section 30 in a plan view: about 50 μm The number of pairs in the lower mirror 10 in the columnar section 30: 4 pairs The lateral current confinement layer 105: an AlGaAs layer at the first layer on the active layer 103 that was oxidized (having a refractive index of 1.6)

The diameter of the current aperture (the inside diameter of 105): 13 μm

The thickness of the lateral current confinement layer 105: 12 nm, 30 nm

The design wavelength λ: 850 nm m in the above-described formula (2): 2

In each of the samples of numerical calculation examples, the thicknesses of the layers composing each of the plural unit multilayer films 10$p$ in the lower mirror 10, and the thicknesses of the layers composing each of the plural unit multilayer films 20$p$ in the upper mirror 20 were decided to have the same ratio. More concretely, they were decided to be in reverse proportion of $n_H$ and $n_L$. Also, the mean refractive index of each of the plural unit multilayer films 10$p$ in the lower mirror 10, and the mean refractive index of each of the plural unit multilayer films 20$p$ of in the upper mirror 20 were given the same $n_D$.

The ratio ($d_A/d_D$) between the thickness $d_A$ of the active layer 103 and the thickness $d_D$ of the unit multilayer film 10$p$, 20$p$ of each of the numerical calculation samples was 1.15 times $2n_D/n_A$ (=1.9325) in the case of the samples No. 1 and No. 4; 1.10 times in the case of the samples No. 2 and No. 5; and 1.05 times in the case of the samples No. 3 and No. 6. Also, as comparison examples, simulation was conducted on samples in which $d_A/d_D$ equals to $2n_D/n_A$, in other words, $d_D=\lambda/4n_H+\lambda/4n_L=\lambda/2n_D$ (=12998 μm), and $d_A=m\lambda/2n_A$ (=0.25119 μm).

The thickness $d_D$ of the unit multilayer film 10$p$, 20$p$, the thickness $d_A$ of the active layer 103, the ratio of $d_A/d_D$, the number of pairs in the lower mirror 10, and the number of pairs in the upper mirror 20, in each of the numerical calculation samples (No. 1-No. 6) and the comparison examples, are shown in Table 1 and Table 2. Table 1 shows the cases where the thickness of the oxidation layer 105 was 12 nm, and Table 2 shows the cases where the thickness of the current oxidation layer 105 was 30 nm. The values presented exceeds a significant figure considering the lattice constant of AlGaAs crystal, but they were used only for calculation convenience, and would not present a particular problem if the values based on the real conditions are used. The thicknesses $d_D$ and $d_A$ were adjusted such that the design wavelength λ was 850 nm. The thicknesses $d_D$ and $d_A$ in each of the numerical calculation samples (No. 1-No. 6) satisfied the formulae (1) and (2) described above.

$$d_D < \lambda/2n_D \quad (1)$$

$$d_A > m\lambda/2n_A \quad (2)$$

where, in the numerical calculation examples, m=2.

Also, the number of pairs was determined by calculating the photon lifetime using one dimensional FDTD method such that the mirror loss, that alters when the thickness $d_D$ of the unit multilayer film 10p, 20p is changed, would become equal in each of the samples. This was conducted only for maintaining the photon lifetime of the zeroth ($0^{th}$)-order resonance mode to be about the same level, for comparison. Cases where the number of pairs is different from the present examples shall not depart from the invention.

TABLE 1

| No. | $d_D$ [μm] | $d_A$ [μm] | $d_A/d_D$ | Number of Pairs in Lower Mirror | Number of Pairs in Upper Mirror |
|---|---|---|---|---|---|
| 1 | 0.12663 | 0.28144 | 1.9325 × 1.15 | 43.5 | 31 |
| 2 | 0.12766 | 0.27139 | 1.9325 × 1.10 | 37.5 | 28 |
| 3 | 0.12878 | 0.26132 | 1.9325 × 1.05 | 35.5 | 26 |
| Comparison Example | 0.12998 | 0.25119 | 1.9325 | 37.5 | 25 |

TABLE 2

| No. | $d_D$ [μm] | $d_A$ [μm] | $d_A/d_D$ | Number of Pairs in Lower Mirror | Number of Pairs in Upper Mirror |
|---|---|---|---|---|---|
| 4 | 0.12630 | 0.28070 | 1.9325 × 1.15 | 43.5 | 31 |
| 5 | 0.12741 | 0.27086 | 1.9325 × 1.10 | 37.5 | 28 |
| 6 | 0.12853 | 0.26080 | 1.9325 × 1.05 | 35.5 | 26 |
| Comparison Example | 0.12998 | 0.25119 | 1.9325 | 37.5 | 25 |

Figure 5:
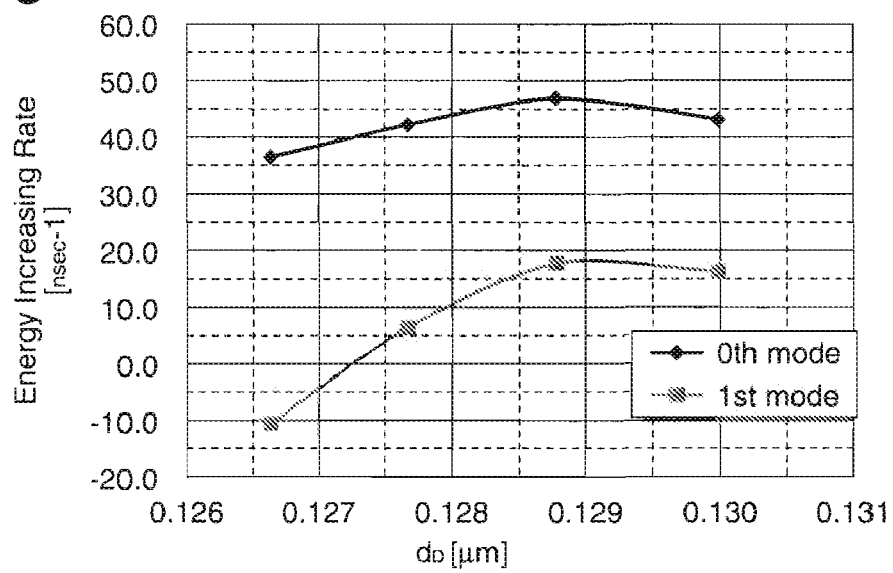
FIG. 5 is a graph showing calculation results of energy increasing rate of resonance light at different modes in numerical calculation examples.
Figure 6:
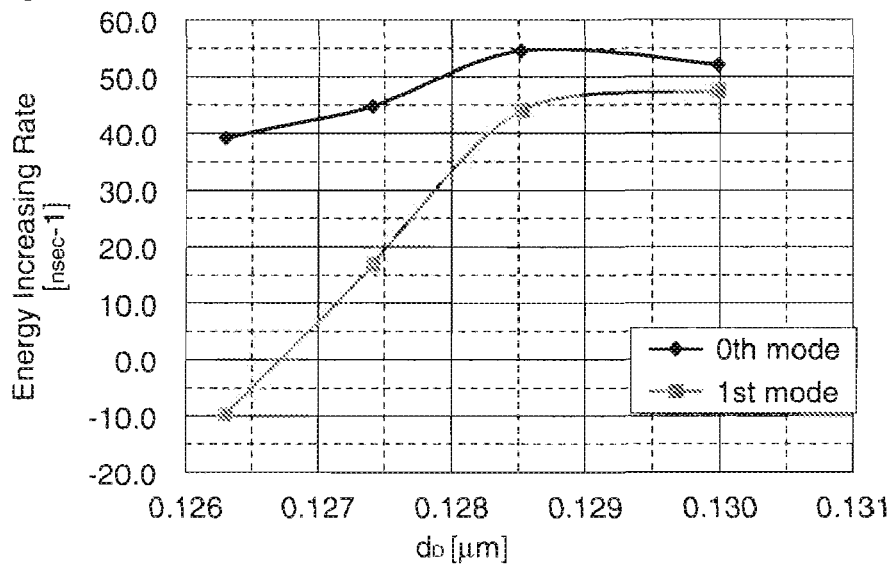
FIG. 6 is a graph showing calculation results of energy increasing rate of resonance light at different modes in numerical calculation examples.

Energy increasing rates of resonance light of the zeroth ($0^{th}$)-order mode and the first ($1^{st}$)-order mode were calculated for each of the numerical calculation samples (No. 1-No. 6) and the comparison example using the two-dimensional FDTD method. The calculation results are shown in FIG. 5 and FIG. 6. It is noted that the calculation was conducted with a gain given to the active layer 103, the amount of which corresponds to injection current. FIG. 5 shows the case where the thickness of the oxidation layer 105 is 12 nm, and FIG. 6 shows the case where the thickness of the oxidation layer 105 is 30 nm. The thickness $d_D$ of the unit multilayer film 10p, 20p is plotted along the abscissas axis, and the energy increasing rate of the resonance light is plotted along the ordinates axis. As shown in FIG. 5 and FIG. 6, when $d_D$ is made smaller ($d_A/d_D$ is made greater), it is observed that the energy increasing rate of resonance light of the first ($1^{st}$)-order mode decreases, while the energy increasing rate of resonance light of the zeroth ($0^{th}$)-order mode scarcely changes. When $d_D$ is made smaller ($d_A/d_D$ is made greater), it is observed that the energy increasing rate of resonance light of the first-order mode changes to negative, and goes into a state that does not arrive at laser oscillation. In other words, among the resonance light, the first or higher-order resonance modes do not arrive at laser oscillation (accordingly, the surface-emitting type semiconductor laser 100 does not emit light of $1^{st}$ or higher order modes as laser), and only the zeroth ($0^{th}$)-order resonance mode causes laser oscillation (accordingly, the surface-emitting type semiconductor laser 100 emits light of $0^{th}$ order mode as laser). Therefore, the laser emitted from the surface-emitting type semiconductor laser 100 can be formed in a single mode. It is noted that, among resonance light, suppression of high-order mode (for example, the first-order mode) is possible irrespective of the thickness of the oxidation layer 105, as indicated in FIG. 5 and FIG. 6.

In the numerical calculation examples described above, the simulation was conducted with the zeroth ($0^{th}$)-order mode, among the resonance light, used as a lower order mode, and the first ($1^{st}$)-order mode as a higher order mode, but the present embodiment is not limited to them lower order modes may be any modes that have lower order numbers than that of higher order modes. Accordingly, for example, as lower order modes, the third or lower order modes may be used, and as higher order modes, the fourth or higher order modes may be used.

4. Next, experimental examples are described.

In the experimental examples, optical simulation on the surface-emitting type semiconductor laser 100 in accordance with the present embodiment was conducted, using the one-dimensional finite-difference time-domain method (FDTD method), and its design was done in a manner that the Q values (corresponding to the light confinement effect in a longitudinal direction due to the one-dimensional calculation) become generally at the same level. By setting the Q values generally at the same level, the threshold currents, in other words, the current values that cause the lowest-order mode to reach laser oscillation can be set generally at the same level. The simulation was conducted on surface-emitting type semiconductor lasers with three conditions A-C. Samples to which the numerical calculation was applied have the following structure. It is noted that, unless specifically noted, the samples have the same structure as that of the exemplary samples for numerical calculation described above.

The unit multilayer film 10p of the lower mirror 10: a film having a two-layer structure composed of an n-type $Al_{0.9}Ga_{0.1}As$ layer (having a refractive index of 3.049), and an n-type $Al_{0.12}Ga_{0.88}As$ layer (having a refractive index of 3.544).

The mean refractive index $n_D$ of the unit multilayer film 10p of the lower mirror 10: $2n_Hn_L/(n_H+n_L)=3.278$ The active layer 103: a layer having a GRIN-SCH (graded-index, separate-confinement heterostructure) structure including a three-QW structure in which quantum well structures each formed from a GaAs well layer (having a refractive index of 3.6201) and an $Al_{0.3}Ga_{0.7}As$ barrier layer (having a refractive index of 3.4297) are laminated in three layers is sandwiched by upper and lower graded index layers composed of AlGaAs The mean refractive index $n_A$ of the active layer 103: 3.3838

The unit multilayer film $20p$ of the upper mirror $20$: a film having a two-layer structure composed of a p-type $Al_{0.9}Ga_{0.1}As$ layer (having a refractive index of 3.049), and a p-type $Al_{0.12}Ga_{0.88}As$ layer (having a refractive index of 3.544)

The mean refractive index $n_D$ of the unit multilayer film $20p$ of the upper mirror $20$: $2n_H n_L/(n_H+n_L)=3.278$ The diameter of oxide aperture $105$: 4.5 μm, 6.0 μm The thickness of the oxidation layer $105$: 12 nm The ratio $d_A/d_D$ between the thickness $d_A$ of the active layer $103$ and the thickness $d_D$ of the unit multilayer film $10p$, $20p$ in each of the samples was set to 1.05 times $2n_D/n_A$ ($=r_0=1.96$) in the condition A, 1.10 times in the condition B, and 1.15 times in the condition C. Also, simulation was conducted on comparison examples in which the ratio $d_A/d_D$ equals to $2n_D/n_A$, in other words, $d_D=\lambda/4n_H+\lambda/4n_L=\lambda/2n_D(=129.66$ nm$)$, and $d_A=m\lambda/2n_A(=253.77$ mm$)$.

The total thickness $d_D$ of the unit multilayer film $10p$, $20p$, the details of $d_D$ (i.e., the thickness of the higher refractive index layer $10H$, $20H$ and the thickness of the lower refractive index layer $10L$, $20L$), the thickness $d_A$ of the active layer $103$, and the ratio of $d_A/d_D$ between $d_A$ and $d_D$ in each of the samples (with the conditions A-C) and the comparison examples, are shown in Table 3. The values presented exceeds a significant figure considering the lattice constant of AlGaAs, but they were used only for calculation convenience, and would not present a particular problem if the values based on the real conditions are used. The design wavelength, the number of pairs in the lower mirror $10$, the number of pairs in the upper mirror $20$, and Q values of the samples (with the conditions A-C) and the comparison samples are shown in Table 4. The thicknesses $d_D$ and $d_A$ in each of the samples (with the conditions A-C) satisfy the above-described formulae (1) and (2).

$$d_D < \lambda/2n_D \quad (1)$$

$$d_A > m\lambda/2n_A \quad (2)$$

where, in the numerical calculation examples, m=2.

TABLE 3

| | $d_D$ [nm] | | | | |
| --- | --- | --- | --- | --- | --- |
| | | Details | | | |
| Condition | Total Thickness | Higher refractive index layer | Lower refractive index layer | dA [nm] | dA/dD |
| Comparison Example | 129.66 | 59.96 | 69.69 | 253.77 | $r_0 = 1.96$ |
| A | 127.64 | 59.03 | 68.61 | 263.34 | 1.05 $r_0$ |
| B | 126.58 | 58.57 | 68.04 | 273.59 | 1.10 $r_0$ |
| C | 125.53 | 58.05 | 67.48 | 283.67 | 1.15 $r_0$ |

TABLE 4

| Condition | Design Wavelength [nm] | The number of pairs in the lower mirror | The number of pairs in the upper mirror | Q value |
| --- | --- | --- | --- | --- |
| Comparison Example | 853.3 | 40.5 | 23 | 15560 |
| A | 850.11 | | 24 | 16040 |
| B | 850.14 | | 25 | 14620 |
| C | 850.18 | | 29 | 15400 |

It is understood from Table 3 and Table 4 that they are designed in a manner that the Q values are generally at the same level in all of the conditions.

Then, the samples described above (with the conditions A-C) were actually manufactured according to the design described above. 144 samples were manufactured for each conditions A-C and comparison example. Mean values of oscillation wavelength (peak wavelength) of the surface-emitting type semiconductor lasers manufactured are shown in Table 5.

TABLE 5

| | | Oscillation Wavelength [nm] | |
| --- | --- | --- | --- |
| Condition | $d_A/d_D$ | Aperture Diameter of Current Constricting Layer 9.0 μm | Aperture Diameter of Current Constricting Layer 12.0 μm |
| A | 1.05 $r_0$ | 852.52 | 850.75 |
| B | 1.10 $r_0$ | 853.93 | 851.87 |
| C | 1.15 $r_0$ | 851.64 | 854.82 |

As shown in Table 5, it is understood that the surface-emitting type semiconductor lasers manufactured oscillate at about the same wavelength in all of the conditions.

Table 6 below shows mean values of threshold currents of the surface-emitting type semiconductor lasers.

TABLE 6

| | | Threshold Current [mA] | |
| --- | --- | --- | --- |
| Condition | $d_A/d_D$ | Aperture Diameter of Current Constricting Layer 9.0 μm | Aperture Diameter of Current Constricting Layer 12.0 μm |
| A | 1.05 $r_0$ | 0.308 | 0.421 |
| B | 1.10 $r_0$ | 0.423 | 0.479 |
| C | 1.15 $r_0$ | 0.393 | 0.425 |

As shown in Table 6, it is understood that the threshold currents are about at the same level in both of the cases where the aperture diameter of the current constricting layer $105$ is 4.5 μm and 6.0 μm. It is understood from this result that the currents that cause the lowest-order mode to reach laser oscillation can be set generally at the same level.

Figure 7:
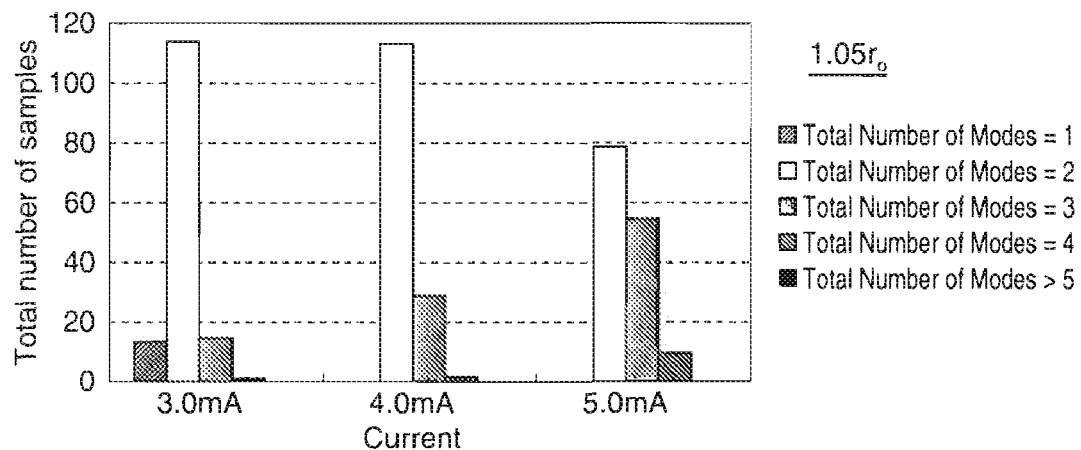
FIG. 7 is a graph showing the relation between the total number of modes and the sum of samples in experimental examples.
Figure 8:
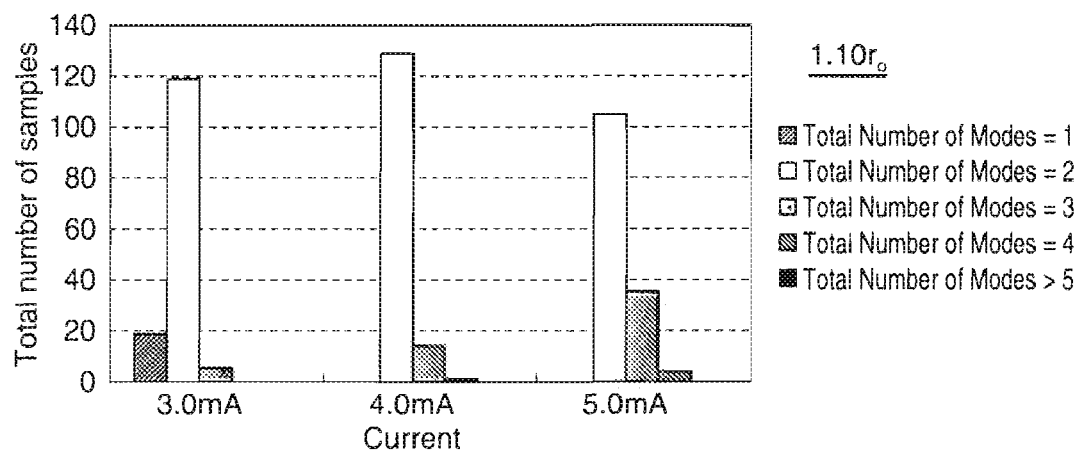
FIG. 8 is a graph showing the relation between the total number of modes and the sum of samples in experimental examples.
Figure 9:
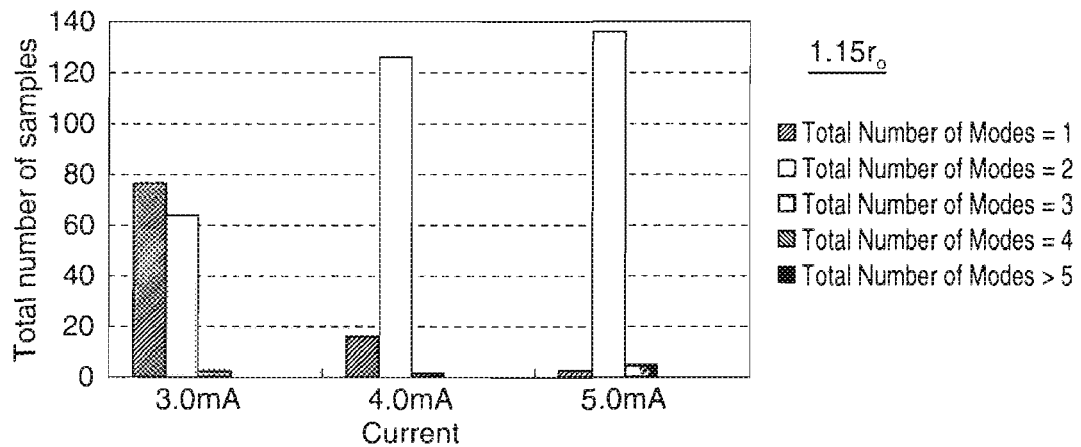
FIG. 9 is a graph showing the relation between the total number of modes and the sum of samples in experimental examples.
Figure 10:
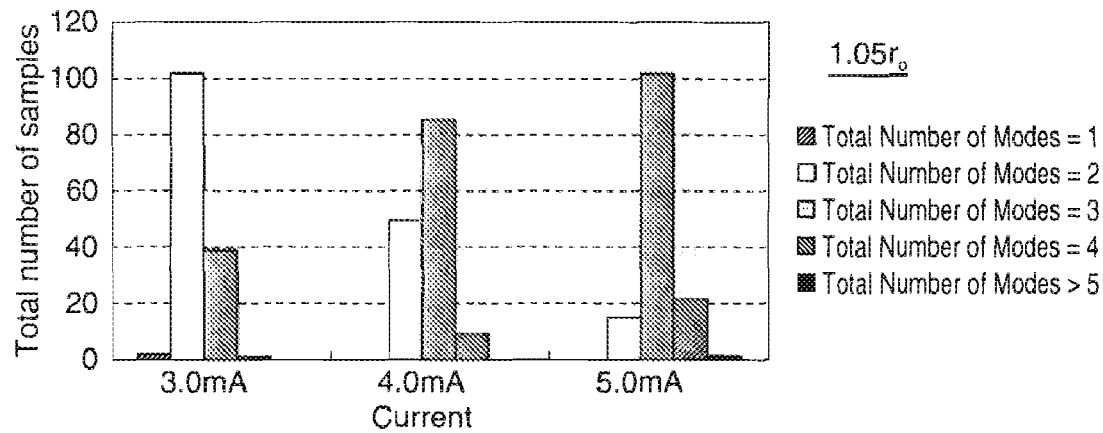
FIG. 10 is a graph showing the relation between the total number of modes and the sum of samples in experimental examples.
Figure 11:
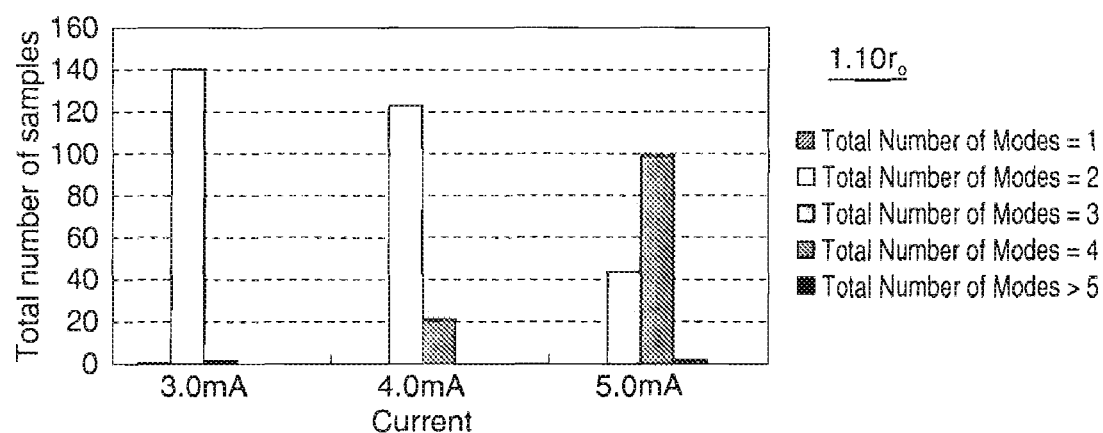
FIG. 11 is a graph showing the relation between the total number of modes and the sum of samples in experimental examples.
Figure 12:
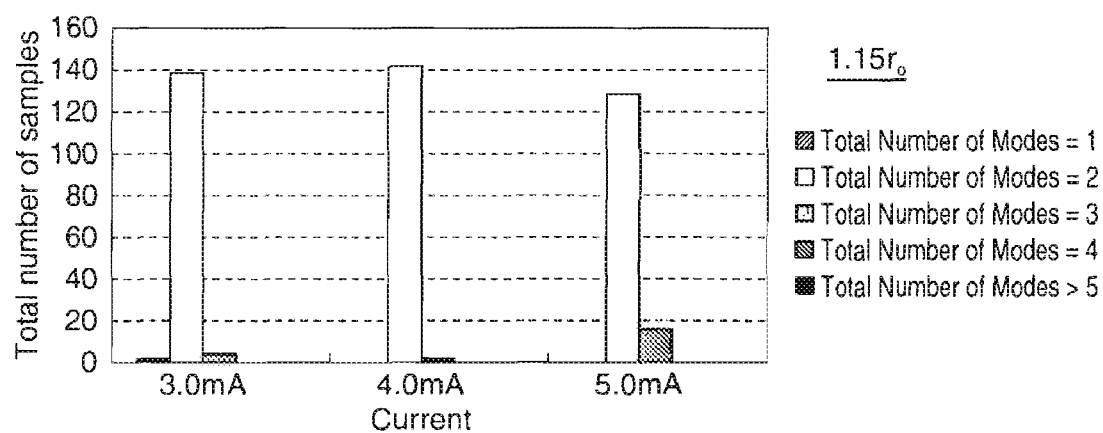
FIG. 12 is a graph showing the relation between the total number of modes and the sum of samples in experimental examples.

Then, currents (3.0 mA, 4.0 mA and 5.0 mA) were injected in each of the samples (with the condition A-C), and the total number of modes emitted from each of the samples (hereafter also referred to as the "total modes") were measured. FIG. 7-FIG. 12 show the total number of samples whose total modes was 1, 2, 3, 4, and 5 or greater, respectively. It is noted that FIGS. 7-9 show the cases where the diameter of oxide aperture $105$ is 4.5 μm, and FIGS. 10-12 show the cases where the diameter of oxide aperture $105$ is 6.0 μm. Also, FIG. 7 and FIG. 10 show the cases with the condition A, FIG. 8 and FIG. 11 show the cases with the condition B, and FIG. 9 and FIG. 12 show the cases with the condition C.

It is observed from FIGS. 7-12 that, in both of the cases where the diameter of the oxide aperture $105$ is 4.5 μm and 6.0 μm, when do is made smaller ($d_A/d_D$ is made larger), at the same current value, the total number of samples with totals modes being 3 or greater decreases. Accordingly, it is understood that, by making the ratio $d_A/d_D$ greater, oscillation of high-order modes (for example, the second or higher-order modes) can be suppressed, while the threshold current is maintained at about the same level. In other words, it is understood that, while the readiness of oscillation of the lowest-order mode is maintained at about the same level, oscillation of high-order modes can be suppressed.

Also, it is understood that the structure with the least total number of samples with the total modes being 3 or greater is not the structure with the condition B ($d_A/d_D=1.10\,r_0$) whose Q value is small (in other words, large threshold current), but is the structure with the condition C ($d_A/d_D=1.15\,r_0$) whose Q value is large (in other words, small threshold current), as indicated in FIGS. 7-12, Table 4 and Table 6. In view of the above, it is understood that oscillation of high-order modes is suppressed in the present experimental results due to the fact that oscillation of high-order modes is suppressed by the effect of the invention, but not that all of the resonance modes become difficult to oscillate due to an increase in the threshold current.

Figure 13:
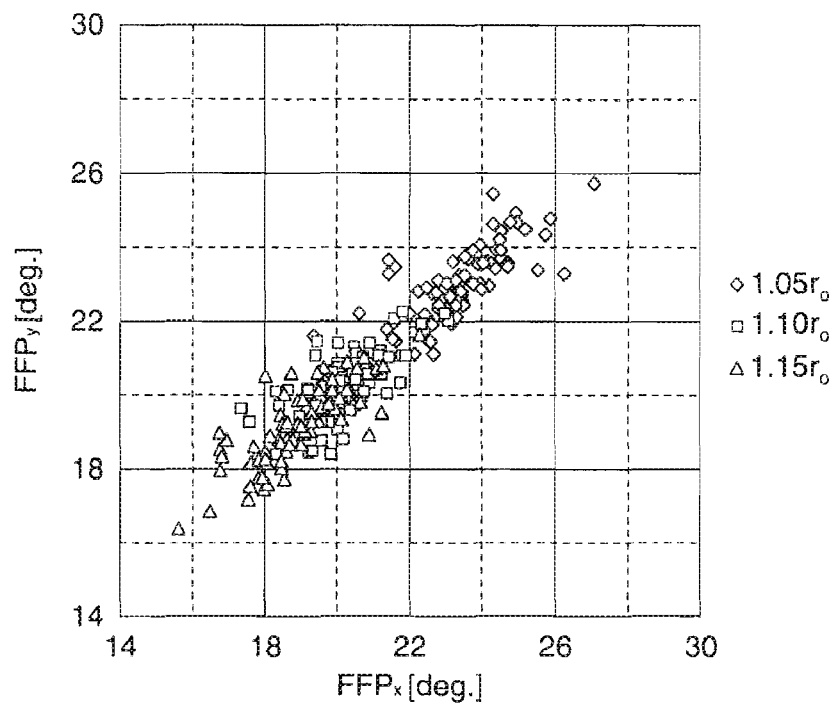
FIG. 13 is a graph showing radiation angles in two orthogonal axes in accordance with experimental examples.
Figure 14:
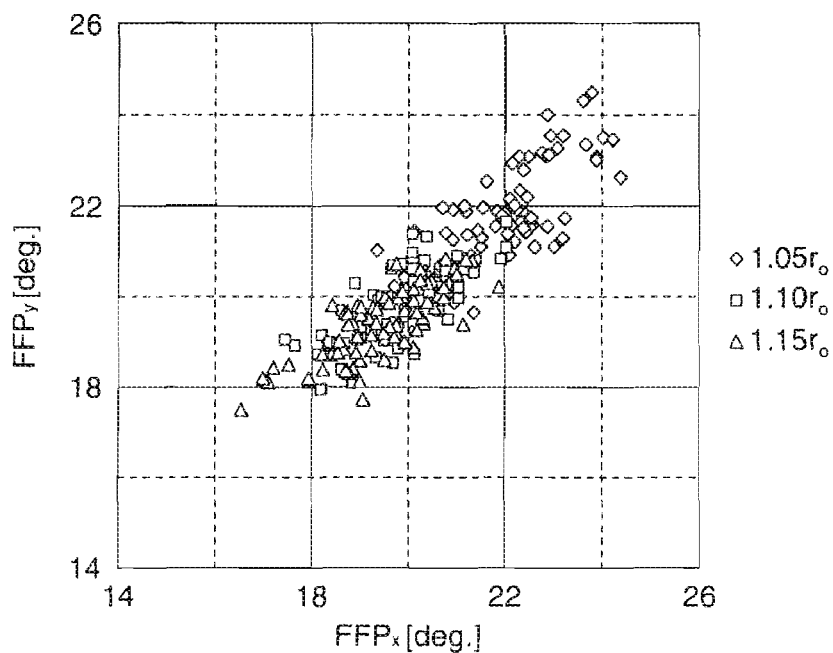
FIG. 14 is a graph showing radiation angles in two orthogonal axes in accordance with experimental examples.

Next, a laser oscillation was caused to occur in each of the samples (with the condition A-C), and the radiation angle of laser light in FFP (Far Field Pattern) was measured. It is noted that the radiation angle is defined by a difference between the angles (total angles) whose maximum intensity is $1/e^2$ (e is the base of the natural logarithm, which is called Napier's constant; e=2.71828 . . . ) on both sides of the angle with the maximum intensity. When the intensity becomes $1/e^2$ at +14 degrees and −13 degrees, the radiation angle is (14−(−13))= 27 degrees. FIGS. 13 and 14 show radiation angles in perpendicularly traversing x-axis and y-axis ($FFP_x$ and $FFP_y$, respectively). It is noted that FIG. 13 shows the case where the diameter of the oxide aperture 105 is 4.5 µm, and FIG. 14 shows the case where the diameter of the oxide aperture 105 is 6.0 µm.

As shown in FIG. 13 and FIG. 14, in both of the cases where the diameter of the oxide aperture 105 is 4.5 µm and 6.0 µm, when $d_D$ is made smaller ($d_A/d_D$ is made larger), it is understood that the radiation angle decreases. This is because, in the surface-emitting type semiconductor laser 100 in accordance with the present embodiment, $k_{//}$ (to be described below) having large values can be excluded as solutions.

5. Next, a modified example of the present embodiment is described. It is noted that features different from those of the embodiment examples described above are described, and description of the same features is omitted.

Figure 15:
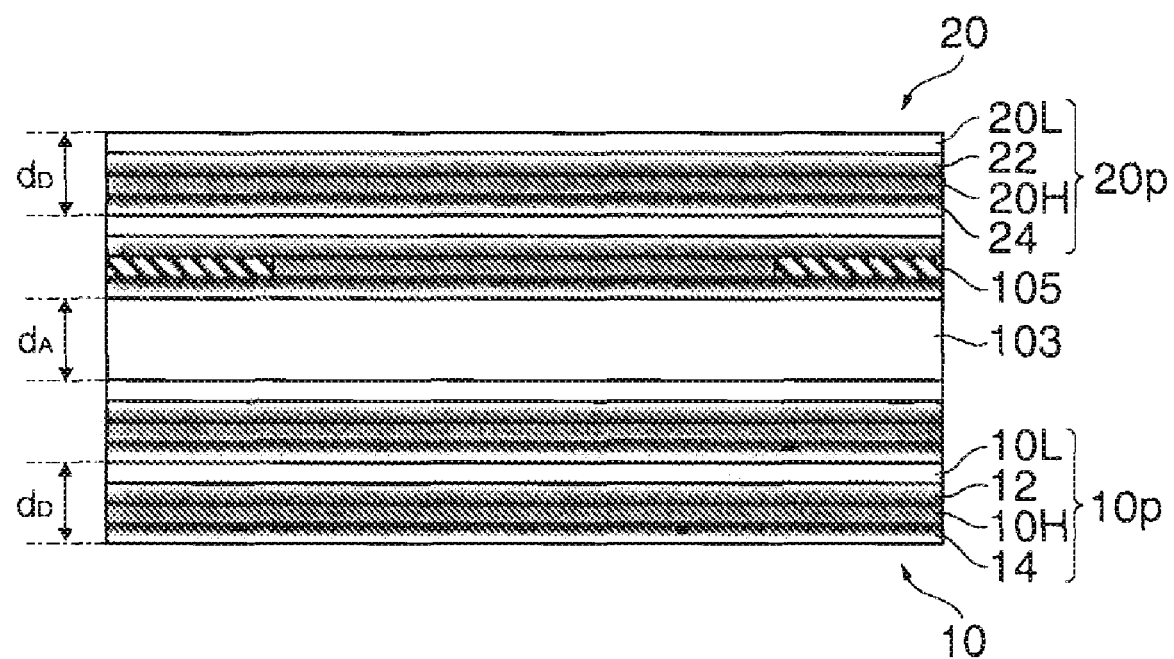
FIG. 15 is a schematic cross-sectional view of a surface-emitting type semiconductor laser in accordance with a modified example of the embodiment of the invention.

FIG. 15 is a schematic cross-sectional view in part of a surface-emitting type semiconductor laser in accordance with the modified example. A unit multilayer film 10p in a lower mirror 10 may be composed of, for example, a lower refractive index layer 10L, a first graded index layer (hereafter referred to as a "first GI layer") 12 formed below the lower refractive index layer 10L, a higher refractive index layer 10H formed below the first GI layer 12, and a second graded index layer (hereafter referred to as a "second GI layer") 14 formed below the higher refractive index layer 10H. As the first GI layer 12, for example, an AlGaAs layer with its Al composition being continuously changed from 0.9 to 0.12 downwardly may be used. Also, as the second GI layer 14, for example, an AlGaAs layer with its Al composition being continuously changed from 0.9 to 0.12 downwardly may be used. Similarly, a unit multilayer film 20p in a upper mirror 20 may be composed of, for example, a lower refractive index layer 20L, a first GI layer 22 formed below the lower refractive index layer 20L, a higher refractive index layer 20H formed below the first GI layer 22, and a second GI layer 24 formed below the higher refractive index layer 20H.

It is noted that the modified example described above is merely an example, and the invention is not limited to this example.

6. In the surface-emitting type semiconductor laser 100 in accordance with the present embodiment, the above-described formulae (1) and (2) are satisfied.

$$d_D < \lambda/2n_D \quad (1)$$

$$d_A > m\lambda/2n_A \quad (2)$$

The energy increasing rate of resonance light of a higher order modes can be reduced, while the energy increasing rate of resonance light of a lower order modes is hardly reduced, irrespective of the thickness of the oxidation layer 105, the aperture diameter, and the inclination angle θ of the mesa (the columnar section 30) and its outer diameter. This was also confirmed with the numerical calculation examples described above. As a result, laser oscillation of high-order modes can be suppressed, without reducing the output of the surface-emitting type semiconductor laser 100. Moreover, even when the output is increased, laser oscillation of high-order modes can be suppressed. Therefore, in accordance with the present embodiment, it is possible to provide a surface-emitting type semiconductor laser which can reduce the number of oscillation modes, and can provide a higher output, compared to the case where the diameter of the lateral current confinement region is simply made smaller. It is noted that, when the aforementioned formulae (1) and (2) are satisfied, the effects of the surface-emitting type semiconductor laser 100 in accordance with the present embodiment can be obtained because of the following reasons.

The magnitude of the wavenumber vector within a resonator $|k|$ is the effective refractive index $n_{eff}$ times the magnitude of wavenumber vector in vacuum $k_0$. This can be expressed by the following formula.

$$|k| = n_{eff}k_0 = \sqrt{k_z^2 + k_{//}^2} \quad \text{[Formula 1]}$$

In the above formula, $k_z$ is a vertical direction component of the wavenumber vector within the resonator, and $k_{//}$ is a plane direction component thereof.

$k_z$ and $k_{//}$ are decided to satisfy the continuity of electromagnetic filed within the range that satisfies the total reflection condition at the boundary between the clad region including the lateral current confinement region 105 and the core region that does not include the lateral current confinement region 105. In the surface-emitting type semiconductor laser, the values of $k_z$ and $n_{eff}k_0$ are close to each other, such that $k_{//}$ has a small value, as is clear from the aforementioned formula. Accordingly, solutions of $k_{//}$ that satisfy the continuity of electromagnetic field described above, in other words, the number of transverse modes that can be allowed on the above formula is limited. In the surface-emitting type semiconductor laser, only those of the modes that satisfy the total reflection condition can oscillate. In the present embodiment of the invention, $k_z$ is made even greater, whereby solutions of $k_{//}$ are further limited than the total reflection condition. $k_z$ can be made greater by reducing the thickness $d_D$ of the unit multilayer film 10p, 20p in the lower mirror 10 and the upper mirror 20. By limiting solutions of $k_{//}$ in this manner, the number of oscillation modes of laser light can be reduced. Also, the wavelengths can be prevented from becoming shorter by making the thickness $d_A$ of the active layer 103 greater.

Accordingly, by making $d_D$ smaller and $d_A$ greater, in other words, by making the thickness ratio $d_A/d_D$ greater (more concretely, greater than $m\,n_D/n_A$), the number of oscillation modes can be reduced, and laser oscillation can be made to occur at a desired design wavelength.

7. Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

For example, the surface-emitting type semiconductor laser in accordance with the embodiment of the invention is applicable to, for example, a device having a heatsink structure, a device having a flip chip structure, a device having a protection structure against electrostatic discharge (ESD) destruction, a device having a monitoring photodiode (MPD), a device having an ink jet microlens, a device having a dielectric mirror, an optical module such as an optical sub-assembly (OSA) using a CAN, a ceramic package or the like, an optical transmission apparatus implementing the aforementioned devices, and the like.

Also, for example, when an epitaxial lift-off (ELO) method is used, the substrate 101 in the surface-emitting type semiconductor laser 100 can be separated. In other words, the surface-emitting type semiconductor laser 100 may be provided without the substrate 101.

What is claimed is:

1. A surface-emitting type semiconductor laser comprising:
a lower mirror;
an active layer formed above the lower mirror; and
an upper mirror formed above the active layer,
each of the lower mirror and the upper mirror being composed of a multilayer mirror in which a plurality of unit multilayer films are laminated, each of the unit multilayer films including a pair of a lower refractive index layer and a higher refractive index layer laminated in a thickness direction, each of the unit multilayer films satisfying a formula (1) below, and the active layer satisfying a formula (2) below, $$d_D < \lambda/2n_D \quad (1)$$

$$d_A > m\lambda/2n_A \quad (2)$$

where $\lambda$ is a design wavelength of the surface-emitting type semiconductor laser, m is a positive integer,
$d_D$ is a thickness of the unit multilayer film,
$n_D$ is a mean refractive index of the unit multilayer film,
$d_A$ is a thickness of the active layer, and
$n_A$ is a mean refractive index of the active layer.

2. A surface-emitting type semiconductor laser according to claim 1, the formula (1) being satisfied by at least one of the plurality of unit multilayer films.

3. A surface-emitting type semiconductor laser according to claim 2, the formula (1) being satisfied all of the plurality of unit multilayer films.

4. A surface-emitting type semiconductor laser according to claim 2, the unit multilayer films that do not satisfy the formula (1) satisfy, a formula (3) below, $$d_D = \lambda/2n_D \quad (3).$$

5. A surface-emitting type semiconductor laser according to claim 1, satisfying a formula (4) below, $$d_H + d_L < \lambda/4n_L + \lambda/4n_H \quad (4)$$

where $d_H$ is a thickness of the lower refractive index layer film,
$d_L$ is a thickness of the higher refractive index layer,
$n_L$ is a refractive index of the lower refractive index layer, and
$n_H$ is a refractive index of the higher refractive index layer.

6. A surface-emitting type semiconductor laser according to claim 1, the lower mirror and the upper mirror being distributed Bragg reflection type (DBR) mirrors.

7. A surface-emitting type semiconductor laser according to claim 1, among light resonated in the active layer, lower order resonance modes arriving at laser oscillation, and higher order resonance modes not arriving at laser oscillation.

8. A surface-emitting type semiconductor laser according to claim 1, among light resonated in the active layer, an energy increasing rate of lower order modes being positive, and energy increasing rate of a higher order modes being negative.

9. A surface-emitting type semiconductor laser according to claim 7, the lower order mode being a zeroth($0^{th}$)-order resonance mode, and the higher order modes being first($1^{st}$) and higher-order modes.

* * * * *